United States Patent [19]

Cross et al.

[11] 4,331,943
[45] May 25, 1982

[54] ACOUSTIC WAVE DEVICES HAVING TRANSVERSE MODE DISTORTIONS ELIMINATED STRUCTURALLY

[75] Inventors: Peter S. Cross, Palo Alto; William R. Shreve, Sunnyvale, both of Calif.

[73] Assignee: Hewlett-Packard Company, Palo Alto, Calif.

[21] Appl. No.: 218,894

[22] Filed: Dec. 22, 1980

[51] Int. Cl.³ .................. H03H 9/145; H03H 9/25
[52] U.S. Cl. ......................... 333/194; 331/107 A; 333/195
[58] Field of Search ............... 333/150-155, 333/193-196; 310/313 R, 313 A, 313 B, 313 C, 313 D; 331/107 A; 358/160, 167, 904, 905

[56] References Cited

U.S. PATENT DOCUMENTS

| | | | |
|---|---|---|---|
| 3,886,504 | 5/1975 | Hartmann et al. | 333/195 |
| 4,060,777 | 11/1977 | Tiersten et al. | 333/194 |
| 4,144,507 | 3/1979 | Shreve | 333/153 X |
| 4,178,571 | 12/1979 | Mitchell | 333/196 X |
| 4,281,301 | 7/1981 | Stevens et al. | 333/151 X |
| 4,301,428 | 11/1981 | Mayer | 333/12 |

OTHER PUBLICATIONS

Tanski, William J., "GHz SAW Resonators", *1979 Ultrasonics Symposium,* Sep., 1979, pp. 815-823.
Hohkawa, Kohji and Shokichiro Yoshikawa, "Temperature Stable Oscillators Employing Parallel Connected SAW Resonators", *1979 Ultrasonics Symposium,* Sep. 1979, pp. 623-626.

*Primary Examiner*—Marvin L. Nussbaum
*Attorney, Agent, or Firm*—Edward Y. Wong

[57] ABSTRACT

The interfering resonances of transverse modes are moade to occur far from the fundamental resonant frequency in a surface acoustic wave (SAW) resonator by connecting a plurality of SAW sub-devices in parallel. The frequency response of this parallel combination is essentially undistorted. Interfering spurious resonances caused by the transverse modes become inconsequential. These devices have a substantially higher power handling capability as compared to conventional resonators with comparable Q. This capability reduces the phase noise of oscillators stabilized by these resonators.

8 Claims, 3 Drawing Figures

ACOUSTIC WAVE DEVICES HAVING TRANSVERSE MODE DISTORTIONS ELIMINATED STRUCTURALLY

BACKGROUND AND SUMMARY OF THE INVENTION

In oscillator circuits it is usually necessary to have a feedback element to stabilize the oscillator. An example of such a feedback element is a surface acoustic wave (SAW) resonator. SAW resonators are well known and fully described in the prior art. For example, they are disclosed by Hartmann, et al. in U.S. Pat. No. 3,886,504 and by Shreve in U.S. Pat. No. 4,144,507, both of which are incorporated by reference herein. In these cited references, there is disclosed a SAW resonator employing two spaced grating structures on a piezoelectric substrate, wherein at least one surface acoustic wave transducer is interposed between the grating structures for generating surface acoustic waves in the piezoelectric material in response to electrical excitation and with the grating structures being so positioned in relation to each other to set up a standing wave resonance condition from the reflection of surface acoustic waves generated by the transducer. The resonance condition of the SAW resonator, then, can be used to stabilize an oscillator circuit.

In order to optimize the stabilization and maximize the signal to noise ratio of an oscillator, it is necessary to maximize the power handling capability in the frequency stabilizing feedback element while maintaining other desirable properties such as high Q and low insertion loss. In a SAW resonator, the power handling ability is proportional to the acoustic aperture or width of the device. Thus, it is desirable to have large acoustic apertures in SAW resonators used to stabilize oscillators. However, a limitation on aperture size arises. Because the SAW resonator structure is essentially a two-dimensional waveguide, the resonator can support a family of transverse waveguide modes whose frequency separations are inversely proportional to the square of the aperture dimension. This phenomenon is fully described by Hermann Haus, "Modes in SAW Grating Resonators", *J. Appl. Phys.* 48 (12), December 1977, pp. 4955-61. As a result, for wide apertures which can handle high power, some transverse modes occur at frequencies very close to the fundamental frequency and can cause substantial distortion of the SAW resonator filter response. This distortion can be manifested, for example, as a reduced Q of the resonator. It can also increase phase noise when the resonator is incorporated into an oscillator and thereby cancel the advantages gained by using a wide aperture. For these reasons, whenever a SAW resonator is used to stabilize an oscillator, it is highly desirable to suppress these transverse modes in the SAW resonator.

In the prior art, various methods of suppressing spurious modes have been attempted. One of the most widely reported methods of suppressing spurious modes is the method of apodization. In this technique, the transducer design is tailored to the fundamental mode of the reflector grating structure such that the transverse modes are not excited. As the frequency of the SAW resonator is increased above about 500 MHz, however, the suppression of transverse modes by this method is no longer a simple matter. A design can be made to suppress transverse modes for specific device parameters, but slight variations that are commonly encountered in resonator fabrication in either transducer metalization or grating definition result in a re-emergence of the problems associated with transverse modes. As a result, it has been reported by workers in this field, e.g., Tanski and Cross, et al. in the *Ultrasonics Symposium Proceedings,* 1979 and 1980, respectively, that there exists a maximum allowable aperture for SAW resonators without transverse mode distortion.

A second method used in the prior art in suppressing transverse modes is to use absorbers to attenuate the transverse modes. The absorber, however, inherently degrades the Q of the resonator since both the desired mode and undesired mode must pass through the absorber.

The spurious frequencies caused by transverse modes are determined by the width of the SAW resonator. In a narrow resonator, the undesired transverse modes are farther from the main modes than in the case of a wide resonator. But narrow resonators have a low power handling capability. To overcome this disadvantage, the resonator in accordance with the preferred embodiment of the present invention provides several individual SAW sub-devices operating in parallel. This parallel combination of SAW sub-devices enables the resonator to handle higher power.

Because of many limitations thought to be associated with it, this parallel technique apparently has not been used for suppressing or minimizing transverse modes. For example, this embodiment of a SAW resonator, that is, connecting sub-devices in parallel to form a single device, has not been used in the past because the resonator structure itself is more complicated, thus requiring more complicated connector structures to make electrical contacts to the parallel resonators.

Still another limitation is the possible introduction of spurious responses by slight variations among the sub-devices. These spurious modes present problems, such as reduced Q of the device and increased oscillator phase noise, that are similar to those generated by transverse modes. In the preferred embodiment, this limitation is overcome by making identical sub-devices on a common substrate.

Another limitation of this technique of parallel operation of devices is the added difficulty in making connections between the parallel beams comprising the sub-devices of this embodiment. In the usual structure of a SAW resonator, connections are made by wide bars that are deposited next to the transducers. In a parallel configuration, these bars must cross through the individual sub-devices. The bars, themselves, can cause spurious resonances and a concomitant degradation of the resonator filter response. This limitation is overcome with the preferred embodiment in accordance with the present invention.

Still another limitation thought to exist with the parallel structure is the added diffraction loss associated with narrow acoustic beams in parallel. Although this loss exists, it has not been found to have been aggravated by a parallel connection of SAW sub-devices because this embodiment is most useful at frequencies where other losses are dominant.

Hartmann, et al., in the reference cited above, made a passing suggestion of paralleling the operation of individual SAW devices for a multi-resonator structure. Their purpose, apparently, was to achieve a desired overall frequency response comparable to that from a multi-pole bandpass filter. No disclosure as to how to practically achieve a parallel operating SAW device or to minimize transverse modes therewith was made. Nor was there a teaching of a parallel operation of individual SAW devices for reducing or suppressing transverse mode distortions.

DETAILED DESCRIPTION OF THE INVENTION

Figure 1:
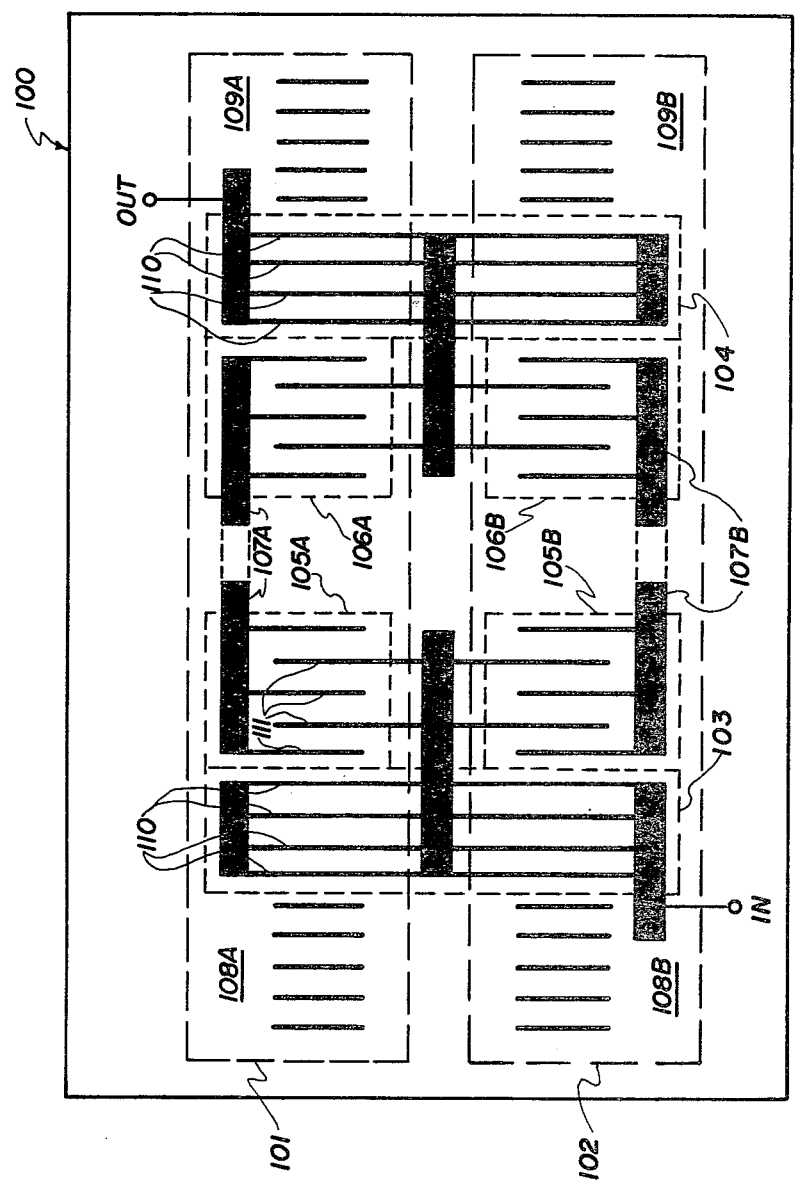
FIG. 1 is a schematic illustration of a SAW device in accordance with the preferred embodiment.
Figure 2:
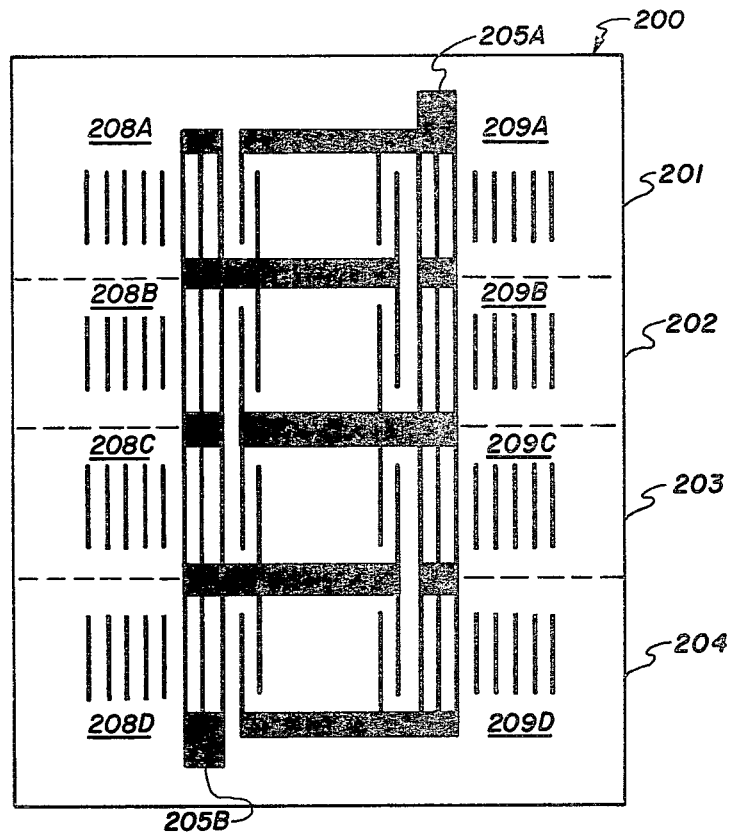
FIG. 2 shows an alternate embodiment of the invention comprising a multi-structure resonator having four one-port sub-devices connected in parallel.
Figure 3:
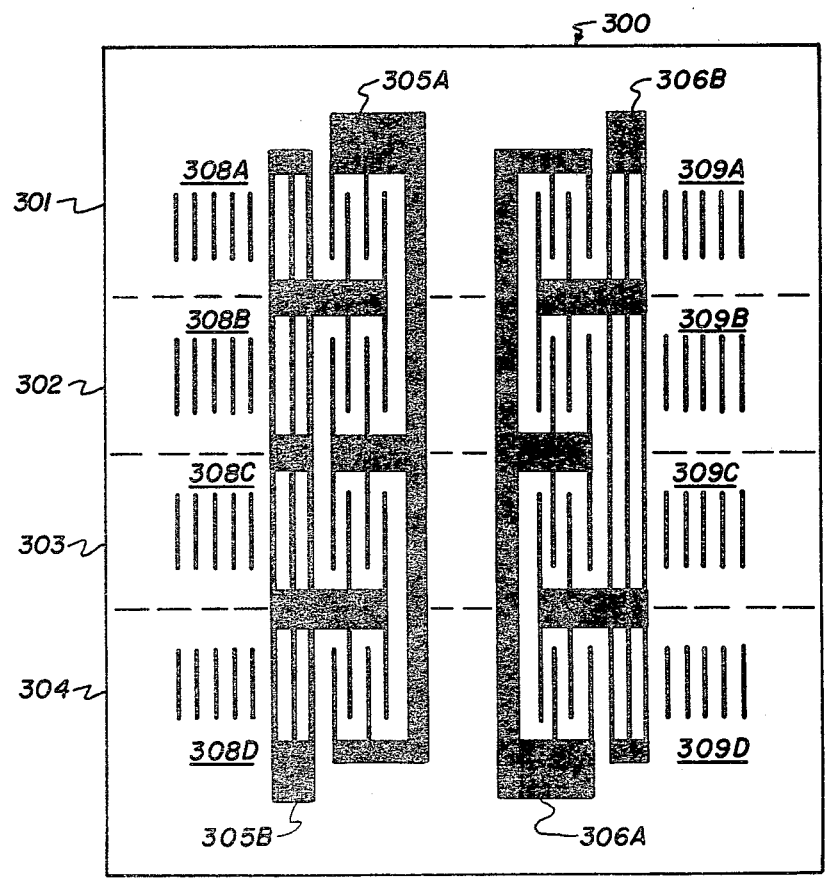
FIG. 3 shows an alternate embodiment of the invention comprising a multi-structure resonator having four two-port sub-devices connected in parallel.

The preferred embodiment in accordance with the present invention is schematically illustrated in FIG. 1. The figure shows two surface acoustic wave (SAW) sub-devices 101 and 102 comprising the multi-structured SAW device 100 as an example; in accordance with the present invention, more than two sub-devices may comprise the device. This is shown in FIGS. 2 and 3, where four sub-devices are in parallel.

Each sub-device consists of two gratings 108 and 109 with an input transducer 105 and an output transducer 106 and their associated electrical connections 103 and 104 disposed between the gratings. The electrical connections 103 and 104 can be solid metal strips, but this approach may introduce distortion of the frequency response. Electrical connections can be made using other metalization configurations or stitch bonded wires without affecting the operation of the multi-structured SAW resonator. In the embodiment of FIG. 1, these connections must be placed between the grating 108 and transducer 105 and between grating 109 and transducer 106. The key to this structure is that each of the sub-devices 101, 102 is made sufficiently narrow to move spurious responses caused by transverse modes away from the resonant frequency of the SAW resonator 100.

Common connectors 103 and 104 provide electrical connection to input transducers 105A and 105B and to output transducers 106A and 106B, respectively. The transducers 105A, 105B, 106A, and 106B in the preferred embodiment are made of interdigitated electrodes 111. The ground portion of these transducers are connected by bars 107A, 107B.

In the preferred embodiment, the common connectors 103 and 104 are made into parallel electrodes 110 that are periodically extensive within the grating structures 108, 109. In this manner, minimal interruption occurs between the transducers 105, 106 and the grating structures 108, 109. A wide, solid connector would interrupt the periodicity of the gratings and could cause spurious resonances between the grating and transducer.

In using the SAW device 100 in accordance with the preferred embodiment in a circuit, only the frequencies of interest near its resonant frequency are coupled to the circuit. Thus, any adverse effects from spurious modes are maintained at a negligible level because of the remoteness of these spurious frequencies from the resonant frequency. Furthermore, because these transverse modes are remote, the frequency characteristic of the SAW device 100 is essentially undistorted in phase or in amplitude.

FIGS. 2 and 3 show multi-structure SAW devices having four sub-devices in parallel. FIG. 2 illustrates a resonator 200 comprising four sub-devices 201–204 with only one port. This single-port resonator 200 has a single transducer 205 placed between its gratings 208, 209. In the preferred embodiment, the electrical connections 205A, 205B to the transducer 205 are made of a plurality of electrodes which are periodically extensive with the grating structures 208, 209.

FIG. 3 illustrates a two-port resonator 300 having four sub-devices 301–304 in parallel. This two-port resonator 300 has two transducers 305, 306 placed between its gratings 308, 309. In the preferred embodiment, the electrical connections 305B, 306B to the transducers 305, 306, respectively, are made of a plurality of electrodes which are periodically extensive with the grating structures 308, 309. The remaining electrical connections 305A, 306A are wide strips placed between the transducers.

We claim:

1. A surface acoustic wave resonator comprising a plurality of substantially identical surface acoustic wave sub-devices, wherein each of said sub-devices comprises:
   common substrate having at least a surface layer of piezoelectric material;
   means defining first and second reflecting grating structures of surface acoustic waves on the piezoelectric surface for providing a standing wave resonance pattern in at least one region of the piezoelectric surface of said substrate;
   at least a first transducer on a region of the piezoelectric surface for launching said surface acoustic waves on the piezoelectric surface of said substrate in response to input electrical energy applied thereto; and
   a first common connector coupled to said first transducer of each sub-device for parallel operation of said plurality of sub-devices.

2. The surface acoustic wave resonator as in claim 1 wherein each of said sub-devices further comprises:
   a second transducer on a region of the piezoelectric surface responsive to said standing wave resonance pattern for providing output electrical energy; and
   a second common connector coupled to said second transducer of each sub-device for parallel operation of said plurality of sub-devices.

3. The surface acoustic wave resonator as in claim 1 wherein said first common connector comprises a plurality of parallel electrodes, each made periodically extensive with said first and second reflecting grating structures.

4. The surface acoustic wave resonator as in claim 2 wherein each of said first and second common connectors comprises a plurality of parallel electrodes, each made periodically extensive with said first and second reflecting grating structures.

5. The surface acoustic wave resonator as in claim 1 wherein said first common connector is a stitch bond.

6. The surface acoustic wave resonator as in claim 2 wherein each of said first and second common connectors is a stitch bond.

7. A method of minimizing adverse effects of transverse mode resonances in a surface acoustic wave resonator comprising the steps of:

fabricating on a common substrate a plurality of substantially identical surface acoustic wave sub-devices, each having at least a first transducer and each being made sufficiently narrow in aperture to move transverse modes away from its resonant frequency;

making a common connection of the sub-device first transducers; and operating the sub-devices in parallel.

8. The method as in claim 7, wherein:

said step of fabricating provides a plurality of substantially identical surface acoustic wave sub-devices, each further having a second transducer; and said method further comprises the step of making a common connection of the sub-device second transducers.

* * * * *